United States Patent [19]

Bandurski

[11] 4,443,284

[45] Apr. 17, 1984

[54] LEAD SADDLE ASSEMBLY AND APPARATUS FOR FORMING

[75] Inventor: Paul S. Bandurski, Palatine, Ill.

[73] Assignee: Cam Fran Tool Co., Inc., Bensonville, Ill.

[21] Appl. No.: 317,246

[22] Filed: Nov. 2, 1981

[51] Int. Cl.³ .................... B29C 27/04; B30B 15/34
[52] U.S. Cl. .................... 156/212; 156/274.4; 156/308.2; 156/380.4; 156/380.5; 156/380.6; 156/380.8; 156/475; 156/521; 156/522; 156/567; 156/583.1
[58] Field of Search ............. 156/379.7, 380.4, 380.5, 156/380.6, 380.7, 380.8, 468, 475, 510, 521, 522, 567, 583.1, 70, 273.9, 274.4, 292, 55, 212, 308.2; 174/112, 117 R

[56] References Cited

U.S. PATENT DOCUMENTS

| | | | |
|---|---|---|---|
| 2,816,596 | 12/1957 | Welch, Jr. ................. | 156/274.4 |
| 3,006,801 | 10/1961 | Pfeffer, Jr. ................. | 156/380.4 |
| 3,421,284 | 1/1969 | Zemek ....................... | 156/522 |
| 3,459,878 | 8/1969 | Gressitt et al. ............. | 174/112 |
| 3,707,425 | 12/1972 | Jamal ........................ | 156/522 |
| 4,360,400 | 11/1982 | Davis et al. ................ | 156/522 |

Primary Examiner—Michael G. Wityshyn
Attorney, Agent, or Firm—Dressler, Goldsmith, Shore, Sutker & Milnamow, Ltd.

[57] ABSTRACT

A lead saddle assembly is disclosed which includes a plurality of insulated wire leads maintained in a spaced, side-by-side array. The assembly includes a lead saddle comprising first and second tape strips disposed on opposite sides of the array. The tape strips include heat-activatable adhesive so that during fabrication the application of heat to a pre-assembly of the wire leads and tape strips adhere the tape strip to each other and to the wire leads as the leads are held in their array. An apparatus and method for forming lead saddle assemblies as described are also disclosed.

19 Claims, 13 Drawing Figures

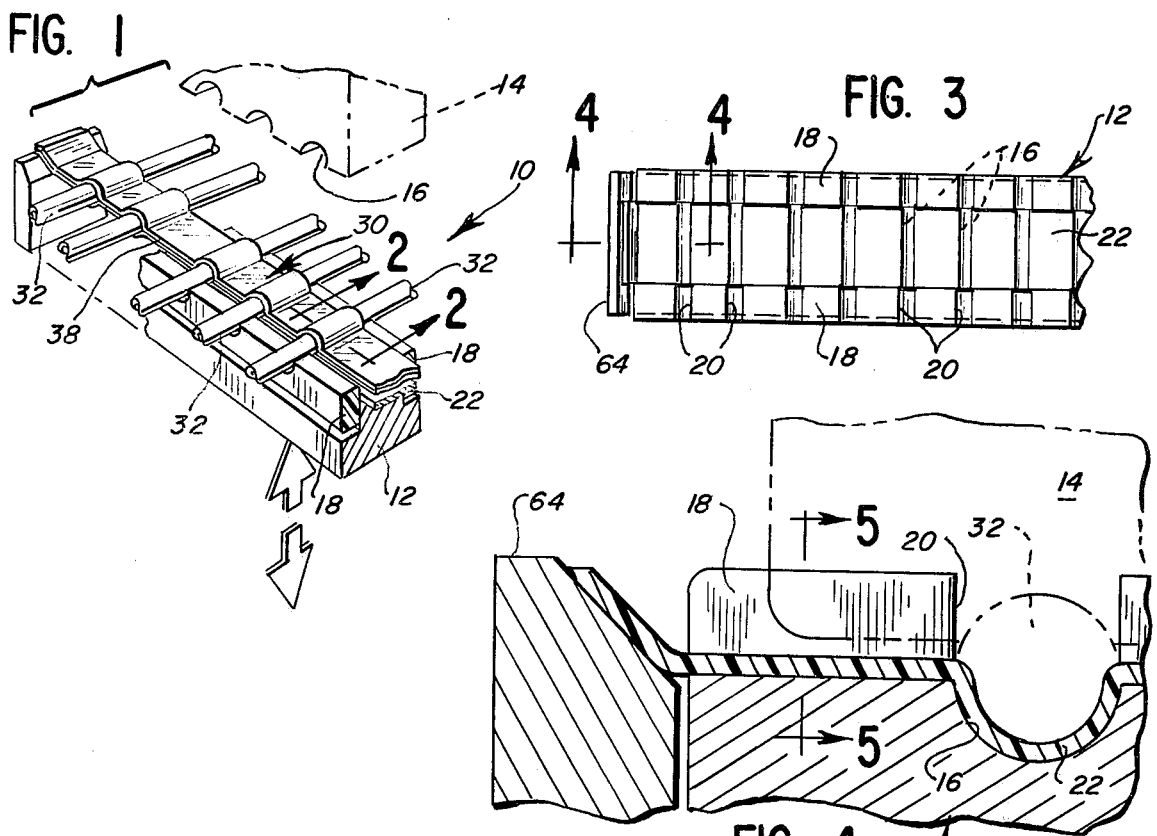
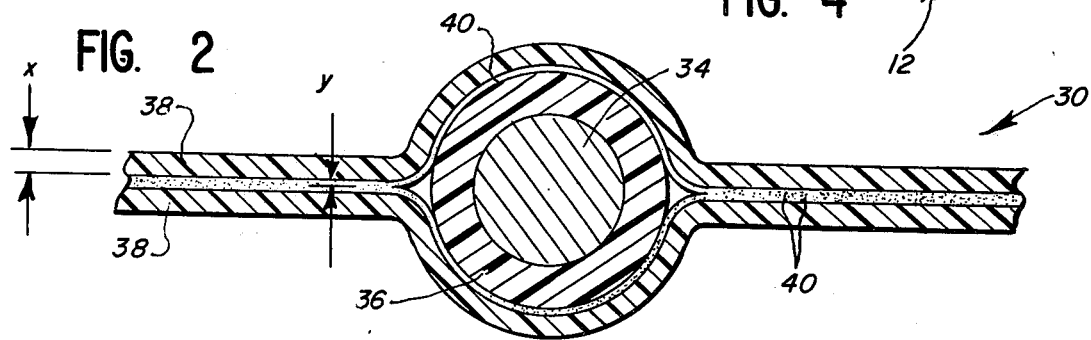
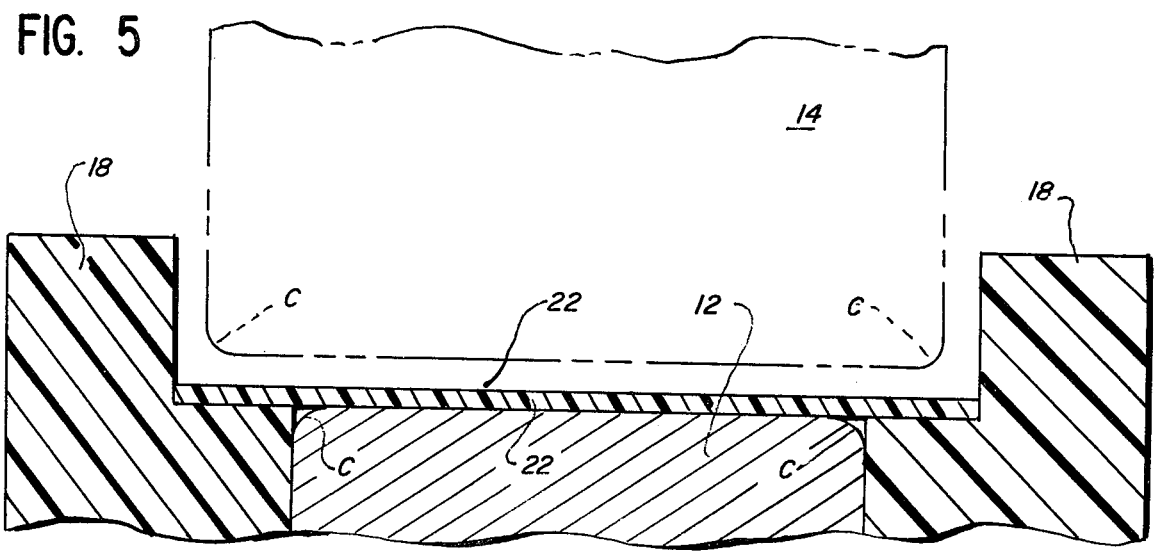

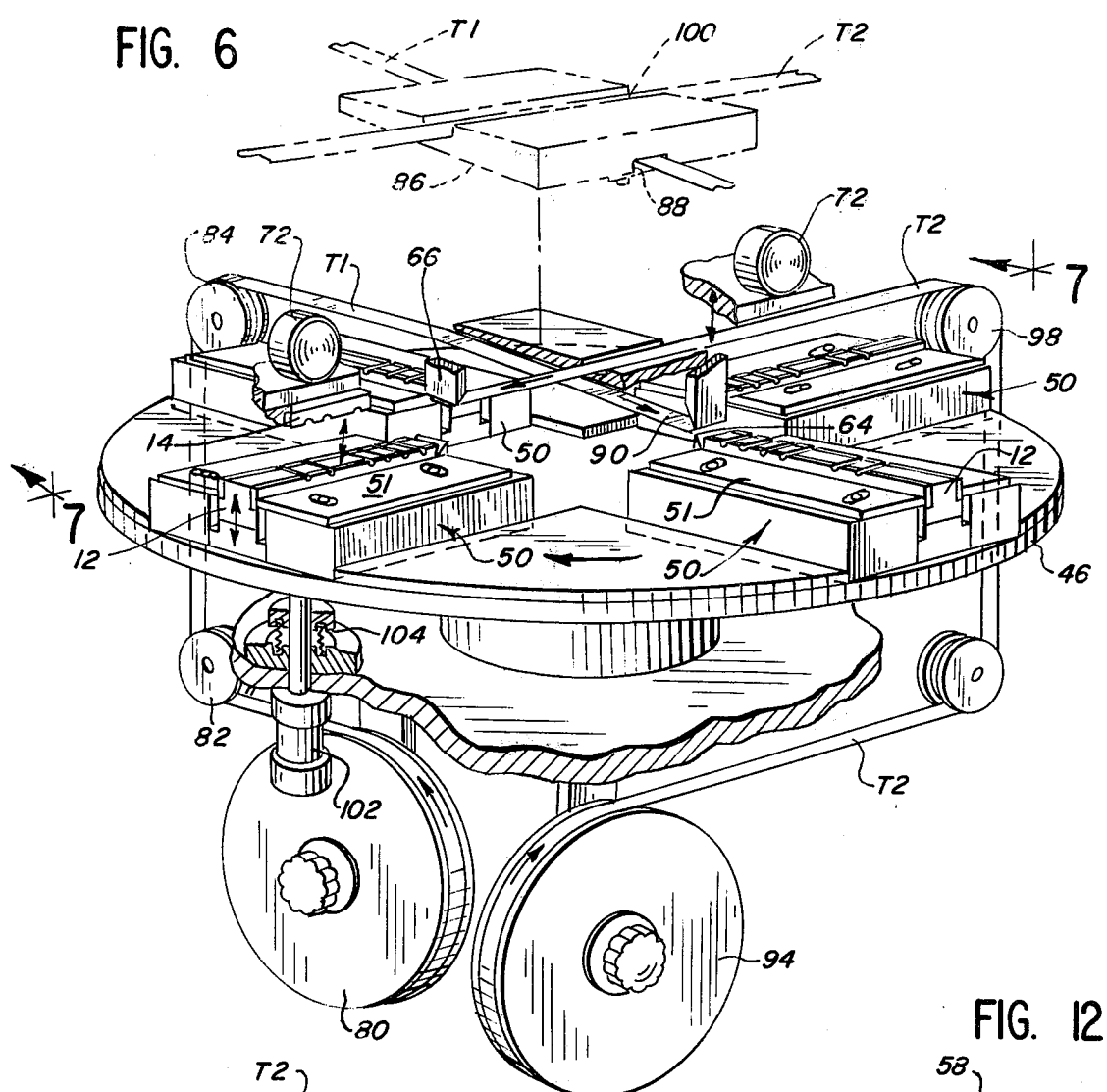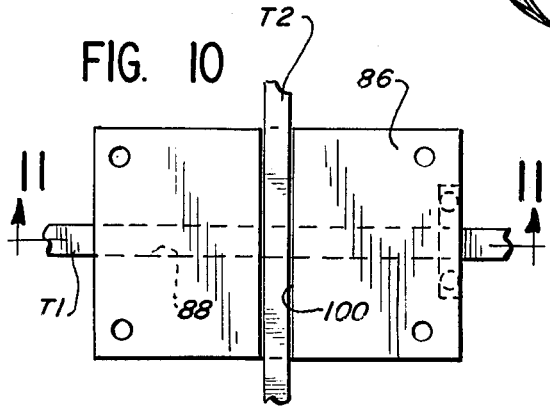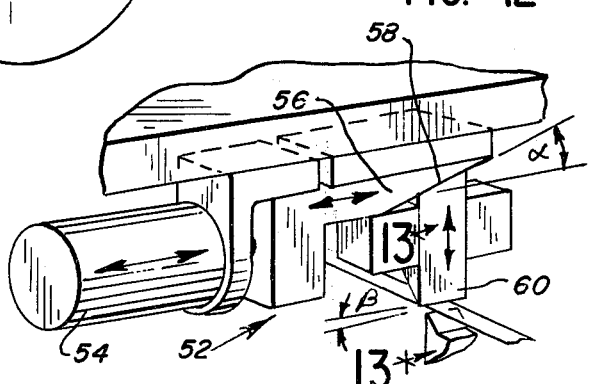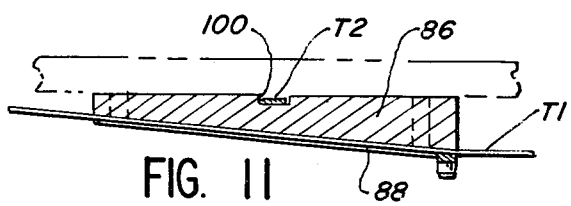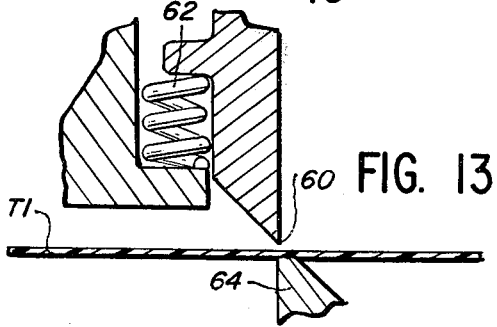

LEAD SADDLE ASSEMBLY AND APPARATUS FOR FORMING

TECHNICAL FIELD

This invention relates to lead saddle assemblies and lead saddle welders.

BACKGROUND OF THE INVENTION

Lead saddle assemblies generally comprise two or more wires of a relatively short length which are temporarily or permanently secured to, and in an array with, each other on a base. The base, or lead saddle, provides a connection for presenting the leads as a group to an appliance or fixture to which the leads are to be connected, the other ends of the leads then being available for connection to corresponding conductors. In many applications four, six or more leads are secured to the base and are held as a lead saddle assembly for connection to the appliance or fixture. If the wire leads were not so secured, the wiring of the appliance or fixture would be much more time consuming.

Various lead saddles have been provided in the past. Some of these utilize staples, as by stapling the leads to a paper or sheet material base. Others use stitching, such as of thread to secure the leads to the base, or adhesive tape to secure the leads to the base.

Depending upon the type of insulation on the wire leads, a tape backing may be suitably welded or fused to the insulation of the leads to provide a saddle for the leads. Lead saddle assemblies of this type are presently available on the market and are made in devices using welders which weld a single tape disposed between a cathode and an anode to juxtaposed leads insulated with thermoplastic insulation. By utilizing a fusible tape which fuses to the thermoplastic insulation of a lead, a relatively permanent lead saddle assembly has been provided. Lead saddle assemblies of this type are efficient and effective, are easier to make than those requiring stapling, stitching or the like, and do not so impair or endanger the insulation that short circuits or the like might result. For example, in stapled lead saddles, sometimes the staple and the conductor come into contact, presenting obvious problems.

However, for conductive leads which utilize a high temperature thermoset insulation, it is not possible to fuse a fusible tape and the insulation to each other, so this type of lead saddle is not effective for high temperature use.

SUMMARY OF THE INVENTION

In accordance with the present invention, a lead saddle suited for use with wire leads having high temperature, non-thermoplastic insulation is provided. Additionally, an effective and efficient mechanism for assembling and making such lead saddle assemblies is disclosed.

The lead saddle assembly itself comprises a plurality of insulated wire leads disposed in a spaced, side-by-side array. While the insulation of the wire leads may be of a variety of materials, the present invention is particularly suited for use where the wire leads have a high-temperature, thermoset, insulation which is not readily fusible.

The lead saddle assembly includes a first tape strip disposed across one side of the array of wire leads in contact with the leads. A second tape strip is provided on the opposite side of the array, and also in contact with the wire leads. Means are provided for joining the first and second tape strips to each other, thereby maintaining the wire leads in their desired array.

In the preferred embodiment, the tape strips comprise a plastic material, preferably polyester. Because the tape is non-fusible to the insulation of the wire leads, at least one and preferably both of the tape strips are provided with adhesive so that the strips may be readily joined and adhered to each other and to the insulation of the wire leads. The adhesive is preferably dry, but heat-activatable, which facilitates handling of the tape strips before the lead saddle assembly is formed, and which assures the integrity of the assembly after fabrication. After fabrication, the wire leads of the assembly are maintained in their side-by-side array in a semi-permanent fashion regardless of the type of insulation they include.

The apparatus of the present invention for forming lead saddle assemblies includes a saddle welder arrangement. One of the cathode element and anode element of the welder is provided with insulation which minimizes arcing, and with grippers which serve to hold the wire leads in their desired array during assembly. In the preferred embodiment the cathode element is provided with insulation.

The apparatus further includes a first tape feed mechanism for dispensing a first tape strip onto that one of the welder elements including the insulation. When the first tape strip is positioned, the wire leads of the lead saddle assembly are positioned manually in the insulating strips and held in the grippers in their side-by-side array.

A second tape feed mechanism is provided for then dispensing a second tape strip onto the welder element in contact with the wire leads thereon and over the first tape strip. The saddle welder then joins the first and second tape strips so that the wire leads are maintained in their array. The apparatus includes means for reciprocably moving the welder cathode and anode elements toward each other. As this occurs, the tape strips and the wire leads are firmly urged into contact with each other, and the welder then joins the tape strips to each other and to the wire leads by passing electrical current through the circuit of which the anode and cathode are a part. When, as in the preferred embodiment, the apparatus is adapted to feed tape strips which include a heat-activated adhesive, heating in this fashion adheres the tape strips to each other and to the wire leads so that the leads are maintained in their array and the lead saddle assembly is completed.

The apparatus for forming lead saddle assemblies of the present invention preferably includes a turntable arrangement upon which a plurality of welding fixtures are provided. The fixtures respectively hold a plurality of either anode or cathode welder elements so each may be moved into confronting relation with the other welder element, which is fixed.

The turntable indexes each fixture between a first loading station where the first tape strip is dispensed, and a second welding station where the second tape strip is dispensed and the tape strips and wire leads are joined. In this fashion, lead saddle assemblies may be efficiently made, with an automatic air ejector provided at the welding station ejecting each completed lead saddle assembly from the saddle welder so that the cycle may be continuously completed.

Other advantages and features of the present invention will become readily apparent from the following detailed description of the invention, from the claims and from the accompanying drawings in which like numerals are employed to designate like parts throughout the same.

BRIEF DESCRIPTION OF DRAWINGS

FIG. 1 shows an assembled, fragmentary lead saddle assembly juxtaposed with a lead saddle welder of this invention;

FIG. 2 is an enlarged cross-sectional view taken substantially along line 2—2 of FIG. 1;

FIG. 3 is a plan view of a portion of the lead saddle welder of FIG. 1;

FIG. 4 is an enlarged cross-sectional view taken substantially along line 4—4 of FIG. 3;

FIG. 5 is an enlarged cross-sectional view taken substantially along line 5—5 of FIG. 4;

FIG. 6 is a perspective view of a turntable and lead saddle welder assembly of this invention;

FIG. 10 is an enlarged view of a portion of FIG. 6;

FIG. 11 is a cross-sectional view taken substantially along line 11—11 of FIG. 10;

FIG. 12 is a perspective view of a portion of the operating mechanism of the lead saddle welder; and FIG. 13 is a sectional view taken along line 13—13 of FIG. 12.

DETAILED DESCRIPTION

Figure 7:
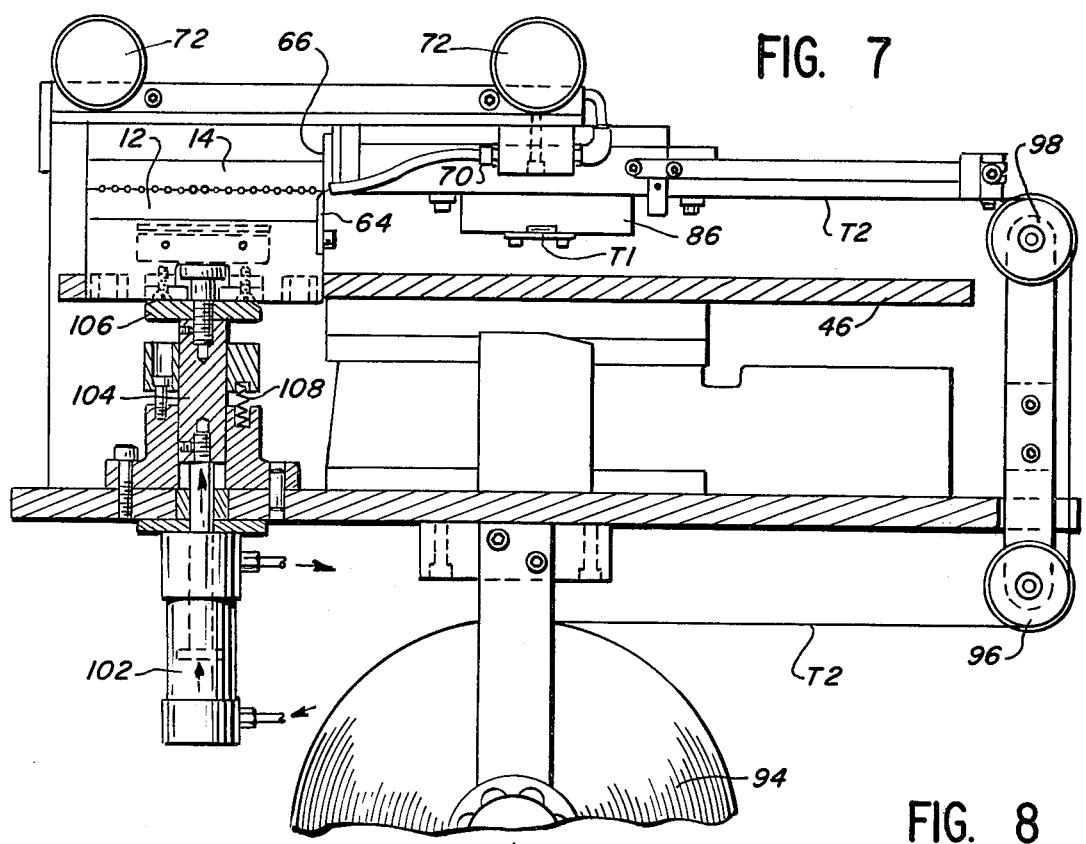
FIG. 7 is a cross-sectional view taken substantially along line 7—7 of FIG. 6.

Referring now to the drawings, FIG. 1 illustrates a lead saddle welder 10 of this invention. It comprises a lower cathode welder element 12, preferably of brass and of an inverted T-shape. It further comprises an upper brass anode welder element 14 (shown in phantom). Cathode 12 and anode 14 each define a plurality of spaced, respectively aligned semi-cylindrical notches 16. Insulation such as an insulating strip 18 is secured at each side of the cathode 12, each of strips 18 defining gripping notches 20 aligned with the cathode notches 16. Strips 18 may be formed of a suitable insulating, temperature resistant elastomer, such as urethane rubber. Insulation 22, such as a thin strip of high temperature insulating material, such as polytetrafluoroethylene, is disposed along the upper surface of the cathode 12 and conforms thereto, being disposed in notches 16, as best illustrated in FIG. 4.

As will be explained, the lead saddle welder 10 is adapted to form lead saddle assemblies, such as lead saddle assembly 30. A lead saddle assembly 30 made in accordance with this invention comprises a plurality of insulated wire leads 32 maintained in a side-by-side array. Each lead 32 comprises a suitable conductor 34 insulated by continuous cylindrical insulation 36. In a preferred embodiment, the insulation is irradiated, cross-linked polyvinylchloride, a thermosetting, non-fusible material. Other high temperature, thermosetting, non-fusible materials, as well as other suitable insulating materials, may also be used.

The lead saddle assembly 30 further includes a lead saddle which comprises a pair of thin tape strips 38 of plastic material, such as polyester. As seen in the drawings, strips 38 closely surround the insulation 36 in generally semi-cylindrical configurations and are preferably adhered thereto and to each other, as by an intervening adhesive layer 40. The adhesive firmly secures the two tape strips to each other, as best illustrated in FIG. 2, and also serves to provide at least a temporary bond between insulation 36 on wire leads 32 and the strips 38 to integrate the lead saddle assembly. Once the leads are assembled in the manner to be described, the leads are removable from the tape strips 38 and lead saddle assembly only with difficulty, thereby providing the desired semi-permanent connection between the lead saddle and the leads themselves so the leads are maintained in their desired array. It will be appreciated, however, that a lead saddle assembly in accordance with the present invention could include tape strips 38 which are fused to each other by heating without the use of adhesive. In that event the leads would be secured to the assembly by friction only.

In a preferred embodiment, the tape strips 38 may be made of polyester of approximately a 7 mil thickness ("X" in FIG. 2). The tape is initially provided with a layer of heat-activatable adhesive, approximately 3 mils in thickness ("Y" in FIG. 2). When the tape strips are presented and welded in the manner to be described, the heat-activatable adhesive is activated and serves then to bond the strips both to the insulation of the wire leads and to each other. It will be appreciated that the thickness of the layer of adhesive between the tape strips themselves, as seen in FIG. 2, will be slightly greater than the thickness of the adhesive adjacent and overlying and underlying the insulation of the wire leads.

As noted, lead saddle welder 10 is provided with a pair of insulating strips 18 on the brass cathode 12. These insulating strips serve to maintain the brass anode 14 and cathode 12 in a spaced-apart disposition during welding, thereby to minimize arcing and damage to the cathode and anode. Further, to minimize arcing and consequent damage, all edges on the brass cathode and anode where they confront are rounded somewhat, as at C. The notches 20 in the insulating strips 18 serve to provide a firm grip for holding wire leads 32 in their array when they are positioned over the lower tape strip 38 of the lead saddle during assembly, thereby to present the wire leads to the upper strip 38 and the anode 14 consistently and in a properly aligned manner. The purpose of the further insulating strip 22 on cathode 12 is to raise the temperature of the welding area defined by the welding elements. The selection of a material such as polytetrafluroethylene for strip 22 was made for its high temperature resistance and durability.

A lead saddle welding assembly of this invention is best shown in FIGS. 6 to 13. The welding assembly comprises a four position, rotatable turntable 46. Each position on the turntable provides a fixture 50 for supporting and mounting a respective cathode 12, as described, for vertical, reciprocating movement. Each fixture 50 engages insulating strips 18 of its respective cathode 12. Turntable 46 is adapted to rotate so as to move and index each fixture 50 and its cathode 12 between a first position (loading station A) where lower tape strip 38 of the lead saddle is dispensed, and a second position (welding station B) where upper tape strip 38 is dispensed and joined to the lower tape strip.

Figure 9:
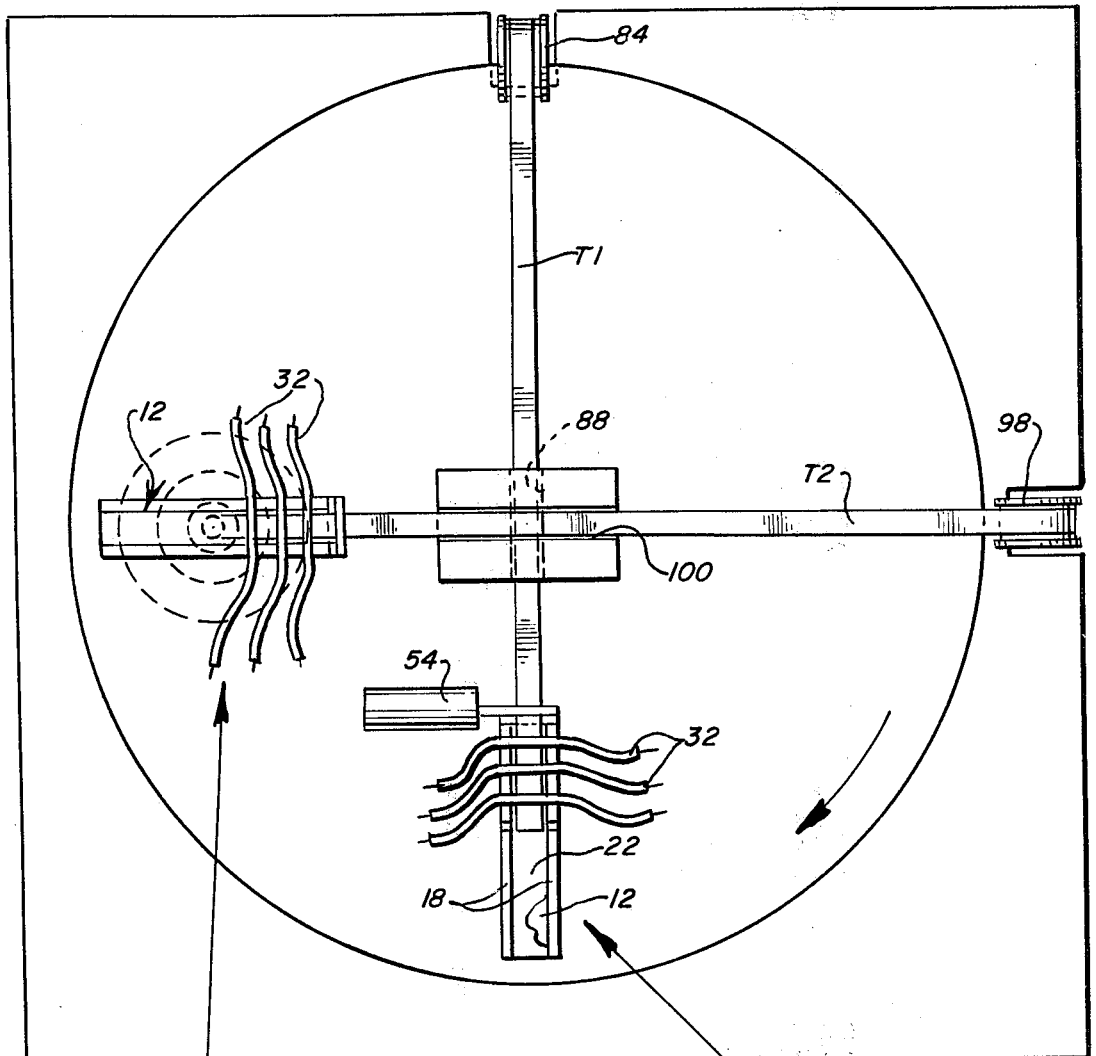
FIG. 9 is a fragmentary view of the tape feed mechanism of the welder assembly of FIG. 6.

As shown in FIG. 9, at station A the lower tape T1 is presented over the insulating strip 22 and between the insulating strips 18 disposed on cathode 12. After tape T1 is in position on insulating strip 22 of cathode 12, the suitable number, type, lengths, etc. of wire leads 32 are placed over T1 (see FIG. 9) and are held in position in gripper notches 20 of insulating strips 18. Thereafter cutter assembly 52 is automatically actuated so that strip 38 from tape T1 is cut to a predetermined length.

As best shown in FIGS. 12 and 13, cutter assembly 52 includes an actuation rod 54 which is moved to the right (FIG. 12) to drive a cam member 56 to the right. Cam member 56 acts against a cam surface 58 to force knife edge 60 downwardly against the biasing force of compression spring 62. Knife edge 60 is preferably disposed at an angle beta from the horizontal so that as the knife edge moves downwardly against tape T1, the edge moves along a cathode knife edge 64, and severs lower tape strip 38 from tape T1.

The assembly is then indexed 90 degrees in response to actuation of the turntable to the next station, welding station B.

Figure 8:
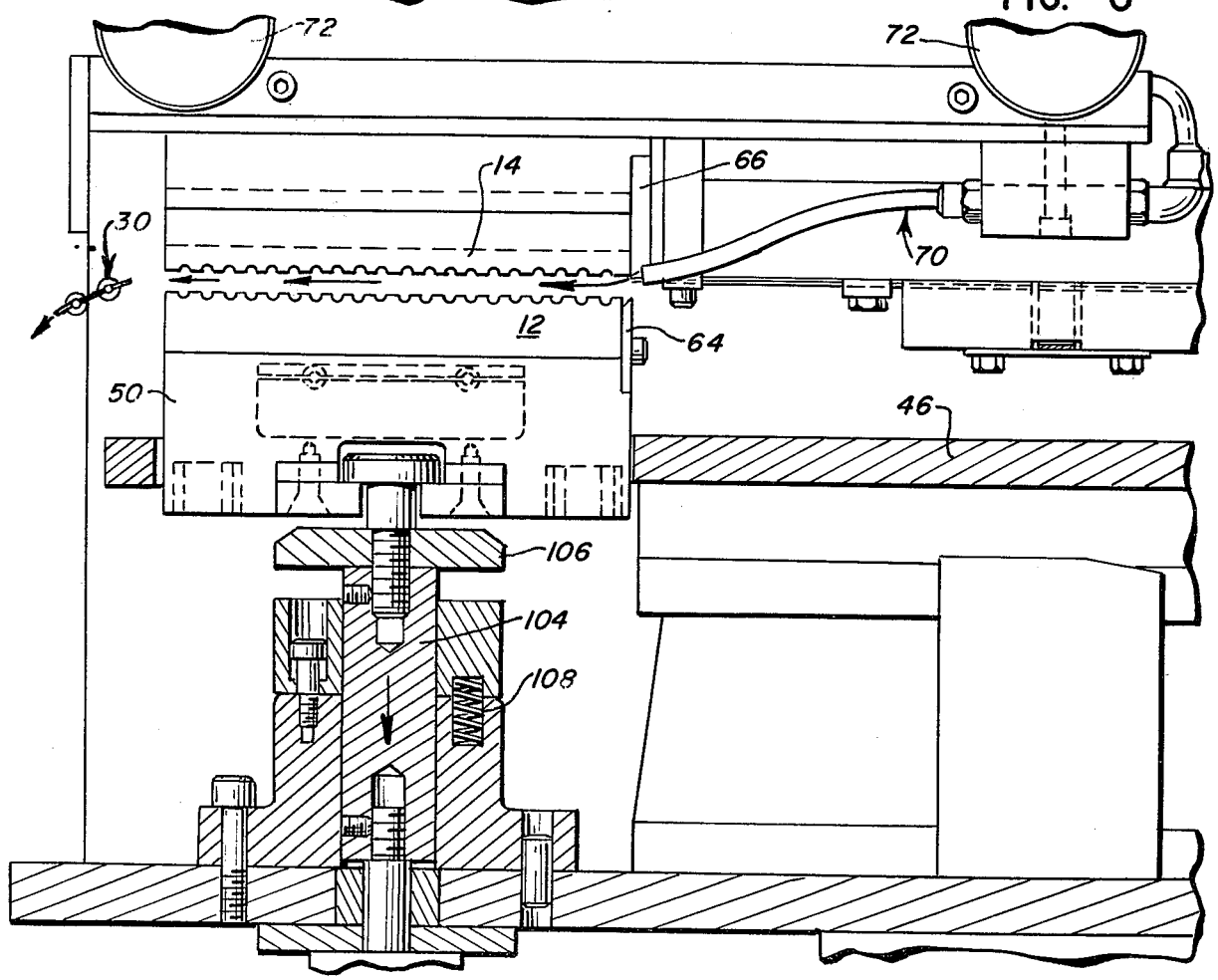
FIG. 8 is an enlargement of a portion of FIG. 7.

At station B, tape T2 is fed automatically for a predetermined length over the lower tape strip 38 and wire leads 32 on cathode 12 and below the anode 14. At that time, the cathode is reciprocated upwardly in fixture 50. As shown in FIGS. 7 and 8, the reciprocating action is preferably provided by a pneumatic cylinder 102 which acts on a plunger 104. Plunger 104 acts on associated plunger 106 which acts against cathode 12 in fixture 50 to urge the cathode upwardly toward anode 14 where it clamps the tape strips for welding.

Cathode 12 carries lower tape strip 38, juxtaposed wire leads 32, and upper tape T2 upwardly. As the cathode 12 is elevated and the cathode and anode moved toward each other, the cathode knife edge 64 is moved parallel to a fixed knife edge 66, to sever the upper tape strip 38 from tape T2. At the same time, the tape strips 38 and leads 32 are firmly urged against each other and against the anode 14, which is fixedly mounted in a suitable insulating fixture, in a pre-assembly substantially like that which is shown in FIG. 2. The welder, including an electrical circuit of which cathode 12 and anode 14 are a part, is then energized. When no adhesive is used the tape strips are fused together. When adhesive is used, the adhesive on the tape strips is heated, hence activated. After a suitable dwell time, such as five (5) seconds, the pre-assembled adhesive bearing tape strips 38 are joined and adhered to each other and to leads 32 to produce a lead saddle assembly in conformity with FIG. 2.

Once the welding (heating) cycle has been completed, the cathode 12 is reciprocated downwardly by plunger 104 of cylinder 102. Thus cathode 12 is moved downwardly to a position slightly below the normal rest position, thereby to allow laterally adjustable stripper plates 51 to strip the lead saddle assembly from the cathode. Spring means 108, which may comprise a plurality of springs, acts to urge the cathode to and into its normal rest position from the slightly lower position to which it was brought by cylinder 102. After the cathode has been moved downwardly by cylinder 102, the lead saddle assembly 10 is removed or ejected from the cathode, as by an appropriately directed blast of air from a suitable source 70 of pressurized air. During the welding cycle at welding station B, another pre-assembly of lower tape strip 38 and wire leads 32 is formed at station A, so that upon indexing from station A, another pre-assembly is ready to be presented at station B.

Tape T1, which is presented at station A for formation of lower tape strip 38, is fed from a supply reel 80, and over idler rollers 82, 84. Tape T1 is threaded under a cross-over bridge 86 in slot 88, down inclined surface 90 and over cathode 12 at station A. Tape T2, from which upper tape strip 38 is formed at station B, is similarly fed from supply reel 94, and over idler rollers 96, 98. Tape T2 extends over cross-over bridge 86 in slot 100 and over cathode 12 at station B.

In the embodiment illustrated, the functions of the lead saddle welding system are under the control of a suitable air logic control system, actuated manually by hand controls 72 when the stations are to be operated and transferred. The welding assembly, cathode 12 and anode 14 utilizes an RF generator developing a 1.5 KW power output, such as are produced by J.A. Callanan Corp. Such a welder will join a three or four lead, lead saddle as described above in about 4 to 7 seconds.

Thus, an improved lead saddle assembly is disclosed together with an apparatus for and method of making the assembly.

From the foregoing, it will be observed that variations and modifications may be effected without departing from the true spirit and scope of the novel concept of the present invention. It will be understood that no limitation with respect to the specific embodiment illustrated herein is intended or should be inferred. It is, of course, intended to cover by the appended claims all such modifications as fall within the scope of the claims.

What is claimed is:

1. A method of forming a lead saddle assembly having a plurality of insulated wire leads disposed in a side-by-side array, comprising the steps of:
   providing a welding assembly comprising welder means defining gripper means for holding said wire leads in said array,
   dispensing a first tape strip onto said welder means,
   placing said wire leads in said gripper means in said array over said first tape strip,
   dispensing a second tape strip onto said welder means after said first tape strip and after said wire leads have been placed in said welder means in said array, and
   energizing said welding assembly for joining said first and second tape strips so that said wire leads are maintained in said array.

2. A method in accordance with claim 1 comprising dispensing tape strips having heat-activatable adhesive whereby when said welding assembly is energized said strips are heated and the adhesive joins said strips to each other and to the insulation of said wire leads.

3. A method in accordance with claim 1, wherein said step of joining said tape strips comprises fusing said tape strips to each other.

4. An apparatus for forming a lead saddle assembly having a plurality of insulated wire leads disposed in a side-by-side array, comprising:
   a welding assembly comprising first welder means,
   first tape feed means adapted to dispense a first tape strip onto said first welder means,
   said first welder means defining gripper means for holding said wire leads in said array over said first tape strip,
   second tape feed means adapted to dispense a second tape strip onto said first welder means after said first tape strip, and after said wire leads are placed thereon in said array, and
   means for energizing said welding assembly for joining said first and second tape strips so that said wire leads are maintained in said array.

5. An apparatus for forming a lead saddle assembly in accordance with claim 4, wherein said energizing means operates said welding assembly to heat said lead saddle assembly.

6. An apparatus for forming a lead saddle assembly in accordance with claim 4, wherein
said welding assembly comprises second welder means and means for moving said first and second welder means toward each other so that said first and second tape strips are urged into contact with each other and with said wire leads.

7. An apparatus for forming a lead saddle assembly in accordance with claim 6, wherein
said energizing means comprises an electrical circuit, and one of said first and second welder means comprises an anode of said circuit and the other comprises a cathode of said circuit, whereby passage of electrical current through said circuit heats said first and second tape strips, whereby heating of said first and second tape strips by said electrical current joins said tape strips to each other.

8. An apparatus for forming a lead saddle assembly in accordance with claim 6, wherein
said first welder means includes insulating gripper means for holding said wire leads in said array, and an insulating strip onto which said first tape strip is dispensed.

9. An apparatus for forming a lead saddle assembly in accordance with claim 6, and
indexing means for moving said first welder means between a first position in association with said first tape feed means, and a second position in association with said second tape feed means.

10. An apparatus for forming a lead saddle assembly in accordance with claim 9, and
ejector means for ejecting said lead saddle from said welding assembly after said first and second pieces of tape are joined.

11. An apparatus for forming a lead saddle assembly in accordance with claim 9, wherein
said indexing means comprise a rotatable turntable supporting said first welder means.

12. An apparatus for forming a lead saddle assembly in accordance with claim 11, wherein
said first welder means comprises a plurality of first welding elements each movable between said first and second positions.

13. An apparatus for forming a lead saddle assembly in accordance with claim 6, wherein
said first tape feed means includes movable cutter means for severing said first tape strip from a continuous strip of tape, and said second tape feed means includes fixed cutter means for severing said second piece of tape from a second continuous strip of tape as said moving means move said first and second welder means toward each other.

14. An apparatus for forming a lead saddle assembly in accordance with claim 13, and
indexing means for moving said first welder means between a first position in association with said first tape feed means, and a second position in association with said second tape feed means.

15. An apparatus for forming a lead saddle assembly in accordance with claim 13, wherein
said movable cutter means include a reciprocably movable blade and a cutter actuator reciprocable generally perpendicularly to said movable blade, and cam means for operatively connecting said cutter actuator and movable blade.

16. An apparatus for forming a lead saddle assembly having a plurality of insulated wire leads having non-fusible insulation, said leads being disposed in a side-by-side array, comprising:
a plurality of first welding elements having wire gripping means each being adapted to hold a set of said plurality of wire leads in said array,
indexing means comprising a rotatable turntable supporting each of said welding elements for movement of each first welding element between a first loading and a second welding station,
first tape feed means for dispensing a first tape strip onto that one of said elements which is at said loading station before said wire leads are disposed on said gripping means,
second tape feed means for dispensing a second tape strip onto a welder element while that welder element is at said welding station and after said wire leads are disposed on said gripping means, and
means for joining said first and second tape strips at said welding station comprising a second welding element, means for moving said welding elements toward each other for urging said first and second tape strips into contact with each other, and means for heating said tape strips for joining them to maintain said wire leads in said array.

17. An apparatus for forming a lead saddle assembly in accordance with claim 16, wherein
said means for heating comprises an electrical circuit, one of said welding elements comprising the anode of said circuit, and the other of said welding elements comprising the cathode of said circuit.

18. An apparatus for forming a lead saddle assembly in accordance with claim 17, and
ejector means for ejecting an assembled lead saddle assembly from the welding elements.

19. An apparatus in accordance with claim 16 further comprising bridge means overlying said turntable under which said first tape strip passes and over which said second tape strip passes as they are directed to said first and second stations respectively.

* * * * *